（12）United States Patent
Ueda

(10) Patent No.: US 10,990,016 B2
(45) Date of Patent: Apr. 27, 2021

(54) EXTREME ULTRAVIOLET LIGHT GENERATION DEVICE

(71) Applicant: Gigaphoton Inc., Tochigi (JP)

(72) Inventor: Atsushi Ueda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/598,042

(22) Filed: Oct. 10, 2019

(65) Prior Publication Data

US 2020/0041909 A1 Feb. 6, 2020

Related U.S. Application Data

(63) Continuation of application No. PCT/JP2017/018254, filed on May 15, 2017.

(51) Int. Cl.
| | |
|---|---|
| *H05G 2/00* | (2006.01) |
| *G03F 7/20* | (2006.01) |
| *G03F 1/24* | (2012.01) |
| *H01L 21/3065* | (2006.01) |

(52) U.S. Cl.
CPC .......... *G03F 7/70033* (2013.01); *G03F 1/24* (2013.01); *H01L 21/3065* (2013.01); *H05G 2/003* (2013.01)

(58) Field of Classification Search
CPC ...... G03F 7/70033; H05G 2/00; H05G 2/005; H05G 2/006
USPC ..................................................... 250/504 R
See application file for complete search history.

(56) References Cited

U.S. PATENT DOCUMENTS

| | | |
|---|---|---|
| 2010/0025231 A1 | 2/2010 | Moriya et al. |
| 2011/0128519 A1 | 6/2011 | Soer et al. |
| 2012/0119116 A1* | 5/2012 | Kakizaki .................. G21K 5/00 250/504 R |
| 2012/0182536 A1 | 7/2012 | Loopstra et al. |

(Continued)

FOREIGN PATENT DOCUMENTS

| | | |
|---|---|---|
| JP | H06-500394 A | 1/1994 |
| JP | 2008-277481 A | 11/2008 |

(Continued)

OTHER PUBLICATIONS

International Search Report issued in PCT/JP2017/018254; dated Aug. 8, 2017.
Written Opinion issued in PCT/JP2017/018254; dated Aug. 8, 2017.

*Primary Examiner* — Jason L McCormack
(74) *Attorney, Agent, or Firm* — Studebaker & Brackett PC

(57) ABSTRACT

An extreme ultraviolet light generation device includes: a chamber (2) having inside a plasma generating region (22) in which plasma is generated from a droplet of a target substance; an EUV light focusing mirror (23) having a reflection surface (23A) that reflects EUV light generated by the droplet being turned into the plasma in the plasma generating region; a magnetic field generation unit configured to generate a magnetic field ML for converging, toward a wall of the chamber, a charged particle generated by the droplet being turned into the plasma; and an etching gas supply unit (32) configured to supply etching gas along the reflection surface from an outer periphery of the EUV light focusing mirror, the etching gas supply unit being configured such that flow speed of etching gas supplied from one side of a plane S is higher than flow speed of etching gas supplied from the other side.

9 Claims, 10 Drawing Sheets

(56) References Cited

U.S. PATENT DOCUMENTS

| | | |
|---|---|---|
| 2012/0223257 A1 | 9/2012 | Nagai et al. |
| 2012/0298134 A1 | 11/2012 | Moriya et al. |
| 2017/0094767 A1* | 3/2017 | Ueda .................... H05G 2/008 |
| 2017/0238407 A1* | 8/2017 | Nagai .................... H05G 2/008 |
| | | 250/504 R |
| 2018/0224748 A1 | 8/2018 | Nagai et al. |

FOREIGN PATENT DOCUMENTS

| | | |
|---|---|---|
| JP | 2008-277529 A | 11/2008 |
| JP | 2011-023712 A | 2/2011 |
| JP | 2011-029639 A | 2/2011 |
| JP | 2013-004369 A | 1/2013 |
| JP | 2013-506280 A | 2/2013 |
| WO | 92/03839 A1 | 3/1992 |
| WO | 2016/006100 A1 | 1/2016 |
| WO | 2017/077641 A1 | 5/2017 |

* cited by examiner

EXTREME ULTRAVIOLET LIGHT GENERATION DEVICE

CROSS-REFERENCE TO RELATED APPLICATIONS

The present application is a continuation application of International Application No. PCT/JP2017/018254 filed on May 15, 2017. The content of the application is incorporated herein by reference in its entirety.

BACKGROUND

1. Technical Field

The present disclosure relates to an extreme ultraviolet light generation device.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure apparatus including an extreme ultraviolet light generation device configured to generate extreme ultraviolet (EUV) light at a wavelength of 13 nm approximately in combination with reduced projection reflective optics.

Proposed EUV light generation devices include the three kinds of devices of a laser produced plasma (LPP) device that uses plasma generated by irradiating a target substance with a laser beam, a discharge produced plasma (DPP) device that uses plasma generated by electrical discharge, and a synchrotron radiation (SR) device that uses orbital radiation light.

LIST OF DOCUMENTS

Patent Documents

Patent Document 1: National Publication of International Patent Application No. 6-500394
Patent Document 2: National Publication of International Patent Application No. 2013-506280

SUMMARY

An extreme ultraviolet light generation device according to an aspect of the present disclosure includes: a chamber having inside a plasma generating region in which plasma is generated from a droplet of a target substance; an EUV light focusing mirror having a reflection surface that reflects EUV light generated by the droplet being turned into the plasma in the plasma generating region; a magnetic field generation unit configured to generate a magnetic field for converging, toward a wall of the chamber, a charged particle generated by the droplet being turned into the plasma in the plasma generating region; and an etching gas supply unit configured to supply etching gas along the reflection surface from an outer periphery of the EUV light focusing mirror, the etching gas supply unit being configured such that flow speed of etching gas supplied from one side of a plane including a magnetic-field axis of the magnetic field and a central axis of the EUV light focusing mirror is higher than flow speed of etching gas supplied from the other side of the plane.

BRIEF DESCRIPTION OF THE DRAWINGS

Embodiments of the present disclosure will be described below as examples with reference to the accompanying drawings.

DESCRIPTION OF EMBODIMENTS

1. Overview
2. Extreme ultraviolet light generation device
  2.1 Entire configuration
  2.2 Operation
3. Extreme ultraviolet light generation device of comparative example
  3.1 Configuration
  3.2 Operation
  3.3 Problem
4. Embodiment 1
  4.1 Partial configuration of extreme ultraviolet light generation device
  4.2 Operation
  4.3 Effect
5. Embodiment 2
  5.1 Partial configuration of extreme ultraviolet light generation device
  5.2 Operation
  5.3 Effect
6. Embodiment 3
  6.1 Partial configuration of extreme ultraviolet light generation device
  6.2 Operation
  6.3 Effect
7. Embodiment 4
  7.1 Partial configuration of extreme ultraviolet light generation device
  7.2 Operation 7.3 Effect
8. Embodiment 5
8.1 Partial configuration of extreme ultraviolet light generation device
8.2 Operation
8.3 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure.

Components identical to each other are denoted by an identical reference sign, and duplicate description thereof will be omitted.

1. Overview

Embodiments of the present disclosure relate to an extreme ultraviolet light generation device configured to generate light having a wavelength called extreme ultraviolet (EUV). In the present specification, extreme ultraviolet light is also referred to as EUV light.

2. Extreme Ultraviolet Light Generation Device 2.1 Entire Configuration

Figure 1:
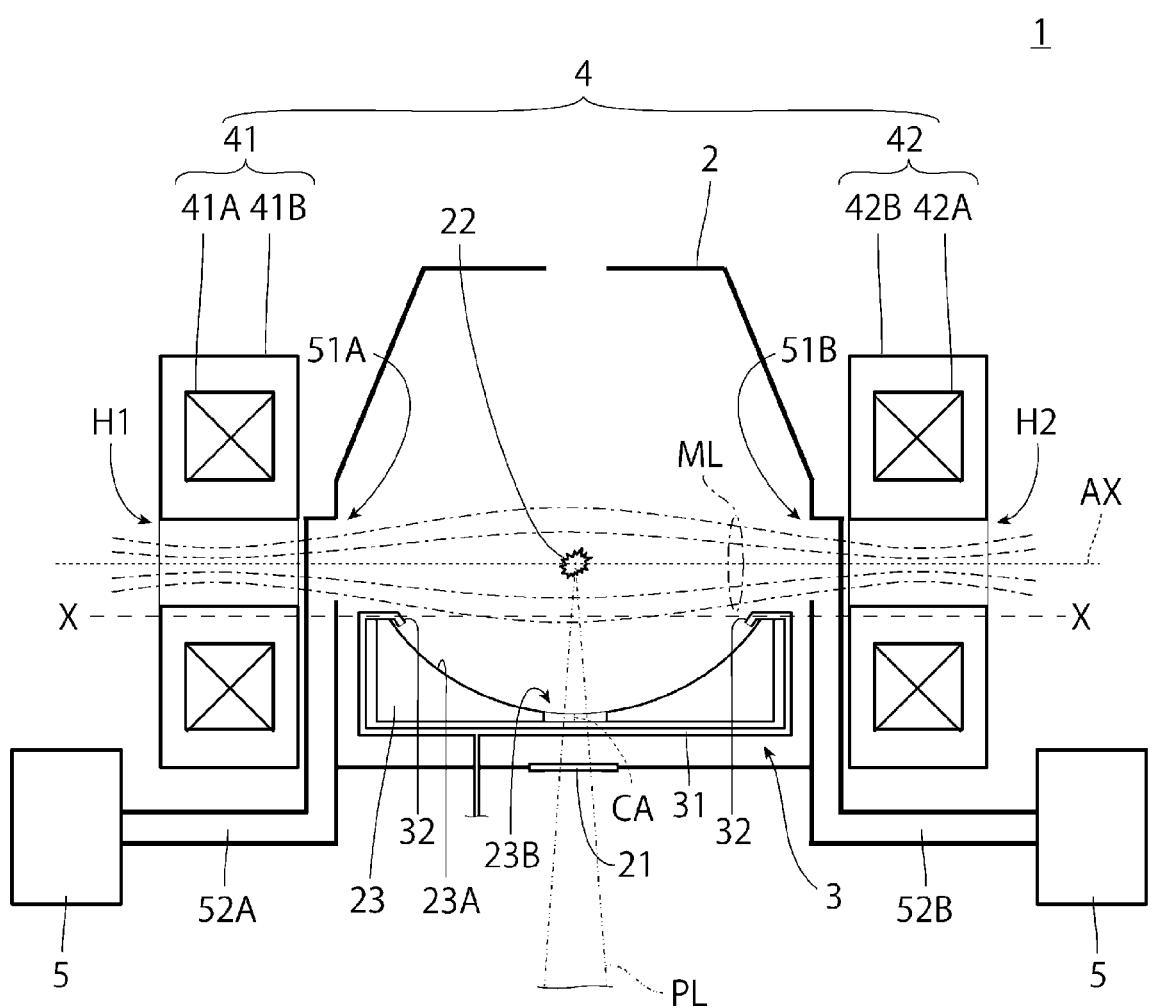
FIG. 1 is a pattern diagram illustrating an exemplary entire schematic configuration of an extreme ultraviolet light generation device.

FIG. 1 is a pattern diagram illustrating an exemplary entire schematic configuration of an extreme ultraviolet light generation device. As illustrated in FIG. 1, this extreme ultraviolet light generation device 1 of the present embodiment includes a chamber 2 and a droplet supply unit (not illustrated in FIG. 1). The chamber 2 is a sealable container that can be depressurized. The droplet supply unit supplies a droplet of the target substance into the chamber 2. For example, the droplet supply unit may supply droplets of the target substance into the chamber 2 at intervals by a continuous jet scheme. The material of the target substance may contain any of tin, terbium, gadolinium, lithium, xenon, or a combination of two or more thereof, but is not limited thereto.

The wall of the chamber 2 is provided with at least one through-hole blocked by a window 21. A laser beam PL in pulses is incident inside the chamber 2 through the window 21, and a plasma generating region 22 inside the chamber 2 is irradiated with the incident laser beam PL. The plasma generating region 22 is a region in which plasma is generated from a droplet of the target substance supplied into the chamber 2.

An EUV light focusing mirror 23 is provided inside the chamber 2. The EUV light focusing mirror 23 condenses EUV light generated from plasma of a droplet in the plasma generating region 22. For example, the EUV light focusing mirror 23 includes a spheroidal reflection surface 23A that reflects the EUV light generated in the plasma generating region 22, and is disposed to have a first focal point positioned in the plasma generating region 22 and a second focal point positioned at an intermediate focal point. The EUV light focusing mirror 23 may have a through-hole 23B about a central axis CA of the EUV light focusing mirror 23 so that the laser beam PL incident in the chamber 2 passes through the through-hole 23B. The EUV light focusing mirror 23 may be provided with a temperature adjuster configured to maintain the temperature of the EUV light focusing mirror 23 substantially constant. The central axis CA of the EUV light focusing mirror 23 may be a straight line passing through the first and second focal points of the reflection surface 23A, or may be the rotational axis of the spheroidal surface.

The extreme ultraviolet light generation device 1 of the present embodiment also includes an etching gas supply unit 3. The etching gas supply unit 3 supplies, to the reflection surface 23A of the EUV light focusing mirror 23, etching gas that reacts with fine particles and charged particles generated from plasma of a droplet. When the material of the target substance is tin, the gas supplied from the etching gas supply unit 3 is gas containing hydrogen such as hydrogen gas. In this case, tin fine particles and tin ions are generated from plasma of a droplet of the target substance in the plasma generating region 22, and react with hydrogen to become stannane ($SnH_4$) gas at room temperature.

The etching gas supply unit 3 may be configured by, for example, a gas supply unit (not illustrated) configured to supply etching gas, a gas introduction pipe 31 coupled with the gas supply unit, and a nozzle 32 coupled with the gas introduction pipe 31 and disposed at an outer periphery of the EUV light focusing mirror 23.

The extreme ultraviolet light generation device 1 of the present embodiment also includes a magnetic field generation unit 4. The magnetic field generation unit 4 generates a magnetic field ML for converging charged particles generated in the plasma generating region 22 toward the wall of the chamber 2.

The magnetic field generation unit 4 may be configured by, for example, a pair of electromagnets 41 and 42 disposed to sandwich facing walls of the chamber 2. The electromagnet 41 includes a superconductive coil 41A, a case 41B enclosing the superconductive coil 41A, and a current supply unit (not illustrated) connected with the superconductive coil 41A. The electromagnet 42 includes a superconductive coil 42A, a case 42B enclosing the superconductive coil 42A, and a current supply unit (not illustrated) connected with the superconductive coil 42A.

The superconductive coils 41A and 42A are disposed so that the plasma generating region 22 is positioned at the middle of the superconductive coils 41A and 42A. The direction of current supplied from the current supply unit to the superconductive coil 41A is same as the direction of current supplied from the current supply unit to the superconductive coil 42A. When such current is supplied to the superconductive coils 41A and 42A, the magnetic field ML having a magnetic flux density that is highest near the superconductive coils 41A and 42A and lower at a position closer to the plasma generating region 22 is generated. The magnetic field ML is also referred to as a mirror magnetic field. The superconductive coils 41A and 42A may be circular coils and may be disposed coaxially with each other. In the following description, the central axis of each circular superconductive coil is a magnetic-field axis AX of the magnetic field ML. However, the present invention is not limited thereto, and when a central axis can be defined for the magnetic field ML generated inside the chamber 2, this central axis may be the magnetic-field axis AX.

It is preferable to reduce a mirror ratio to efficiently converge charged particles generated in the plasma generating region 22 toward the wall of the chamber 2. The mirror ratio is the ratio of the magnetic flux density near the superconductive coils 41A and 42A relative to the magnetic flux density in the plasma generating region 22 positioned at the middle of the superconductive coils 41A and 42A. In addition, the shape of the magnetic field ML may be controlled to efficiently converge charged particles generated in the plasma generating region 22 toward the wall of the chamber 2. For example, the shape of the magnetic field ML can be controlled by the number of turns of each of the superconductive coils 41A and 42A, the magnitude of the current applied to the superconductive coils 41A and 42A, and the like.

The magnetic field generation unit 4 may generate a magnetic field for converging charged particles from the one electromagnet 41 side to the other electromagnet 42 side through the plasma generating region 22. The magnetic field generation unit 4, which is achieved by the pair of electromagnets 41 and 42, may be achieved by a pair of permanent magnets. The electromagnets 41 and 42 or the permanent magnets as magnets for generating a magnetic field may be positioned inside the chamber 2.

The extreme ultraviolet light generation device 1 of the present embodiment also includes a discharge unit 5. The discharge unit 5 discharges residual gas in the chamber 2. The residual gas includes fine particles and charged particles generated from plasma of droplets, products generated therefrom through reaction with etching gas, and unreacted etching gas. Some charged particles are neutralized in the chamber 2. The residual gas includes the neutralized charged particles.

For example, the discharge unit 5 may acquire the residual gas in the chamber 2 from discharge ports 51A and 51B provided to the wall of the chamber 2 through discharge pipes 52A and 52B coupled with the discharge ports 51A and 51B, and may provide predetermined discharge treatment on the residual gas.

In the example illustrated in FIG. 1, the discharge ports 51A and 51B are positioned on the magnetic-field axis AX of the magnetic field ML, but may be positioned downstream of the EUV light focusing mirror 23 in the flow of etching gas supplied from the etching gas supply unit 3. However, the discharge ports 51A and 51B are preferably positioned on the magnetic-field axis AX of the magnetic field ML to efficiently discharge charged particles generated in the plasma generating region 22.

In the example illustrated in FIG. 1, the discharge pipe 52A is disposed to pass between the chamber 2 and the electromagnet 41, but may be disposed to penetrate through a through-hole H1 of the superconductive coil 41A. Similarly, in the example illustrated in FIG. 1, the discharge pipe 52B is disposed to pass between the chamber 2 and the electromagnet 42, but may be disposed to penetrate through a through-hole H2 of the superconductive coil 42A. In addition, a trapping mechanism such as a heater configured to trap fine particles may be provided to at least one of the pair of discharge ports 51A and 51B and the discharge unit 5. The discharge unit 5 may maintain the pressure in the chamber 2 substantially constant.

2.2 Operation

The etching gas supply unit 3 ejects etching gas from the nozzle 32 disposed at the outer periphery of the EUV light focusing mirror 23, and supplies the etching gas along the reflection surface 23A from the outer periphery. The magnetic field generation unit 4 generates the magnetic field ML having a magnetic flux density that is highest near the superconductive coils 41A and 42A and lower at a position closer to the plasma generating region 22, and the discharge unit 5 maintains the pressure in the chamber 2 substantially constant. The magnetic flux density of the magnetic field ML is, for example, 0.4 T to 3 T, preferably 0.5 T to 1.5 T. The pressure in the chamber 2 is, for example, 10 Pa to 100 Pa, preferably 15 Pa to 40 Pa.

In this state, a droplet of the target substance is supplied into the chamber 2, and the droplet having reached the plasma generating region 22 in the chamber 2 is irradiated with the laser beam PL.

Plasma is generated from the droplet irradiated with the laser beam PL, and radiates light including EUV light. The EUV light is selectively reflected by the reflection surface 23A of the EUV light focusing mirror 23 and is output to an exposure apparatus (not illustrated) connected with the chamber 2.

As described above, a charged particle is generated from plasma of a droplet. The charged particle receives Lorentz force and moves on a trajectory that rotates in a plane orthogonal to the magnetic field line. When the charged particle moving in this manner has a speed component in a direction toward the discharge ports 51A and 51B, the charged particle moves toward the wall of the chamber 2 while converging on a helical trajectory along the magnetic field line. Then, the charged particle is induced to the discharge ports 51A and 51B provided to the wall of the chamber 2 near a convergence place of the magnetic field ML. Thus, the density of charged particles is higher in a region in which charged particles move while converging than in the other space. The region in which charged particles move while converging is referred to as a charged-particle convergence region. The charged-particle convergence region includes the plasma generating region. As described above, some of charged particles generated from plasma of droplets are neutralized. Charged particles having reached inside the discharge pipes 52A and 52B through the discharge ports 51A and 51B flow into the discharge unit 5 in discharge flow and are provided with predetermined discharge treatment at the discharge unit 5. When charged particles generated in the plasma generating region 22 are guided to the discharge ports 51A and 51B by the magnetic field ML and are discharged in this manner, damage on the reflection surface 23A of the EUV light focusing mirror 23 due to collision with the charged particles is prevented.

As described above, a fine particle is generated from plasma of a droplet. Such a fine particle is not affected by the magnetic field ML generated by the magnetic field generation unit 4 and thus diffuses in the chamber 2. Some of fine particles diffusing in the chamber 2 adhere to the reflection surface 23A of the EUV light focusing mirror 23. The fine particles adhering to the reflection surface 23A react with etching gas supplied along the reflection surface 23A from the etching gas supply unit 3, and become certain generated products through the reaction. When the fine particles are tin fine particles and the etching gas contains hydrogen as described above, such a generated product is stannane gas at room temperature. At high temperature, stannane separates from hydrogen, and tin fine particles are likely to be generated. Thus, when the generated product is stannane, the temperature of the EUV light focusing mirror 23 is preferably maintained at 60° C. or lower to prevent the separation from hydrogen. The temperature of the EUV light focusing mirror 23 is more preferably 20° C. or lower.

Generated products obtained through reaction with etching gas move toward the discharge ports 51A and 51B in the flow of unreacted etching gas. At least some of charged particles not converged to the discharge ports 51A and 51B by the magnetic field ML and at least some of fine particles not adhering to the reflection surface 23A of the EUV light focusing mirror 23 react with part of unreacted etching gas flowing in the chamber 2. Generated products obtained through this reaction move toward the discharge ports 51A and 51B in the flow of unreacted etching gas. At least part of the unreacted etching gas flows into the discharge ports 51A and 51B.

The unreacted etching gas having flowed into the discharge ports 51A and 51B and components contained in the etching gas such as fine particles, charged particles, neutralized charged particles, and generated products described above flow into the discharge unit 5 in discharge flow and are provided with predetermined discharge treatment such as detoxification at the discharge unit 5. Various materials in the chamber 2 are discharged in this manner, which reduces accumulation of neutralized charged particles and fine particles on the reflection surface 23A of the EUV light focusing mirror 23 in the chamber 2.

3. Extreme Ultraviolet Light Generation Device of Comparative Example

The following describes an extreme ultraviolet light generation device of a comparative example. Any component identical to that in the above description is denoted by an identical reference sign, and duplicate description thereof will be omitted unless otherwise stated.

3.1 Configuration

Figure 2:
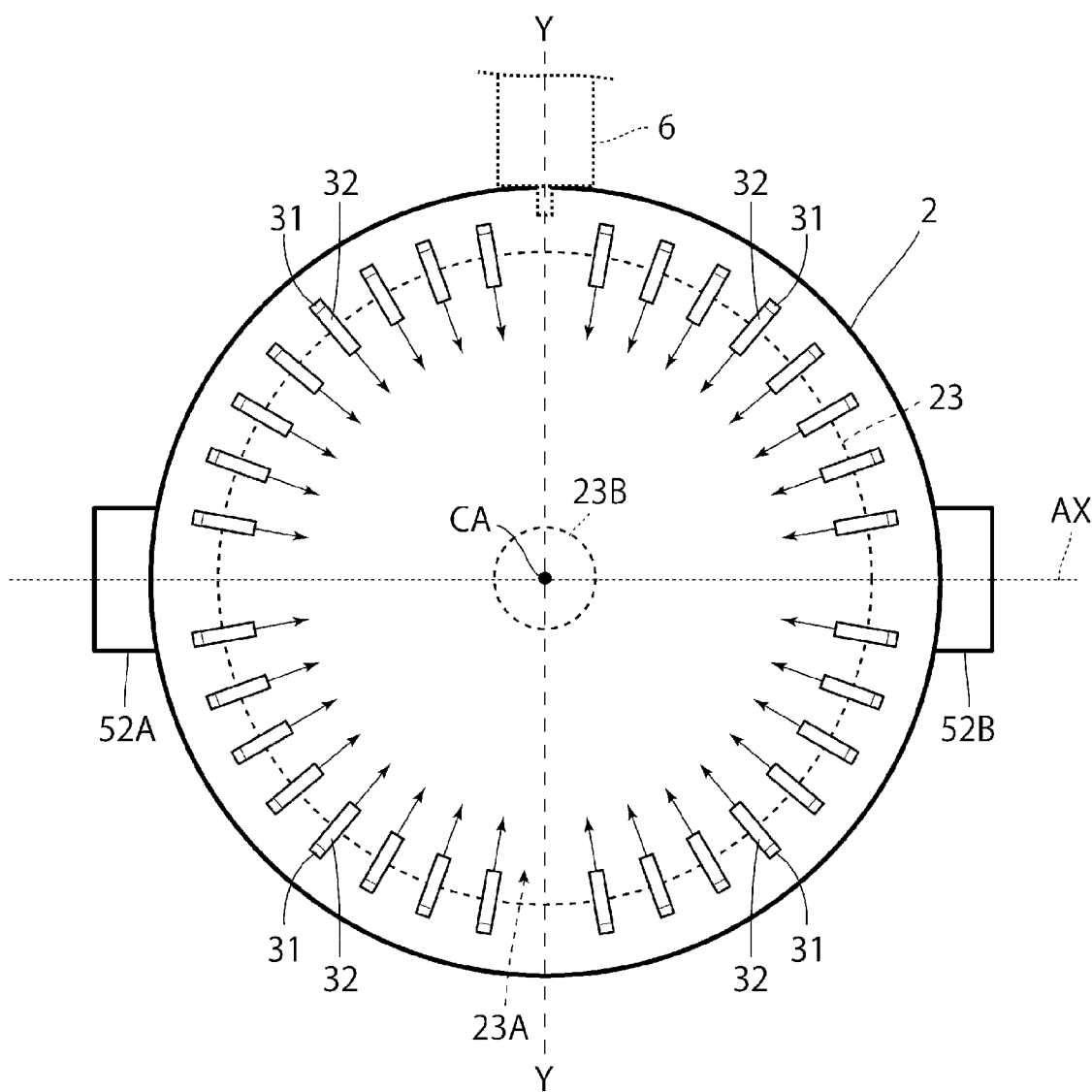
FIG. 2 is a pattern diagram of a schematic configuration of an extreme ultraviolet light generation device of a comparative example, illustrating a section taken along line X-X in FIG. 1.

FIG. 2 is a pattern diagram of the configuration of the extreme ultraviolet light generation device of the comparative example, illustrating a section taken along line X-X in FIG. 1. However, the magnetic field generation unit 4 is omitted in FIG. 2. As illustrated in FIG. 2, in the extreme ultraviolet light generation device of the comparative example, a plurality of the nozzles 32 are disposed at intervals substantially across the entire outer periphery of the EUV light focusing mirror 23. The nozzles 32 may be disposed at equal intervals. Each nozzle 32 has an ejection port disposed pointing toward the central axis CA of the EUV light focusing mirror 23.

FIG. 2 illustrates a droplet supply unit 6, which is not illustrated in FIG. 1. However, the droplet supply unit 6 is not disposed on line X-X in FIG. 1 and thus is illustrated with a dashed line. In the present example, the droplet supply unit 6 is provided on the wall of the chamber 2 at a plane including the magnetic-field axis AX in FIG. 1 and is orthogonal to the central axis CA of the EUV light focusing mirror 23, and part of the droplet supply unit 6 is disposed in the chamber 2.

3.2 Operation

The etching gas supply unit 3 supplies etching gas along the reflection surface 23A from each nozzle 32 disposed at the outer periphery of the EUV light focusing mirror 23. The flow speed of supplied etching gas is substantially equal between the nozzles 32.

Figure 3:
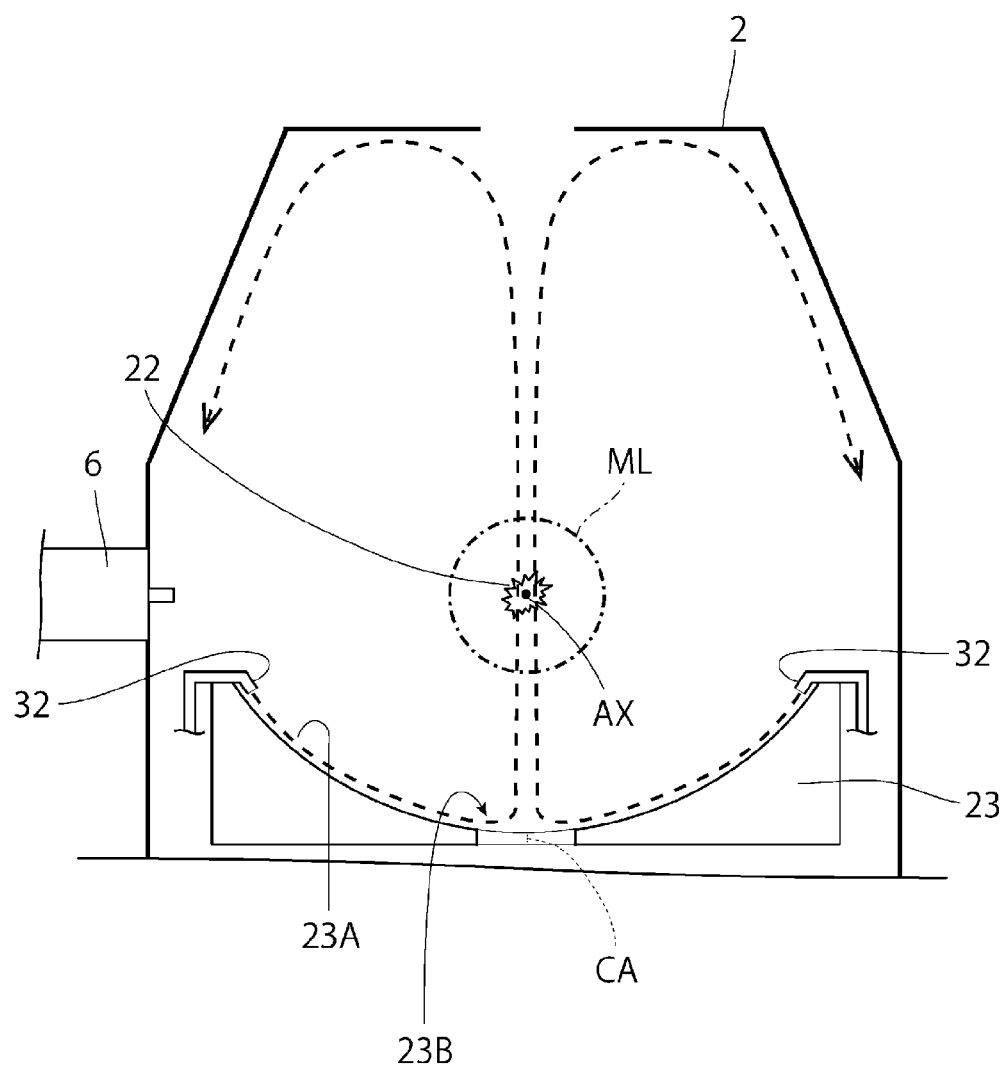
FIG. 3 is a pattern diagram illustrating the flow of etching gas in a chamber in the comparative example.

FIG. 3 is a pattern diagram illustrating the flow of etching gas in the chamber in the comparative example. FIG. 3 illustrates a section taken along line Y-Y in FIG. 2. As illustrated in FIG. 3, etching gas flows toward the central axis CA along the reflection surface 23A of the EUV light focusing mirror 23 and collides with one another near the central axis CA. Accordingly, the etching gas flows upward along the central axis CA in a direction departing from the reflection surface 23A, and flows toward the wall of the chamber 2 through the magnetic field ML including the plasma generating region 22.

Thereafter, the etching gas flows along the wall of the chamber, and part of the etching gas flows into the discharge ports 51A and 51B provided to the wall of the chamber 2. As described above, the etching gas having flowed into the discharge ports 51A and 51B is discharged through the discharge unit 5 together with components contained in the etching gas such as fine particles, charged particles, neutralized charged particles, and generated products described above.

3.3 Problem

In the extreme ultraviolet light generation device of the comparative example, etching gas is supplied along the reflection surface 23A from the nozzles 32 disposed substantially across the entire outer periphery of the EUV light focusing mirror 23. Accordingly, the etching gas joins with one another near the central axis CA of the EUV light focusing mirror 23 and flows upward through the plasma generating region 22. Thus, the flow of etching gas flowing upward is stronger than the flow of etching gas along the reflection surface 23A of the EUV light focusing mirror 23.

Accordingly, fine particles generated in the plasma generating region 22 are diffused in the chamber 2 by etching gas flowing through the charged-particle convergence region including the plasma generating region 22 and are likely to accumulate on the reflection surface 23A of the EUV light focusing mirror 23. In addition, charged particles generated in the plasma generating region 22 are diffused by the etching gas when moving to the discharge ports 51A and 51B along the magnetic field line of the magnetic field ML and are likely to accumulate in the chamber 2.

Charged particles accumulating in the chamber 2 are likely to be neutralized. In addition, charged particles accumulating in the chamber 2 generate new fine particles through collision with fine particles in the chamber 2 in some cases. Accordingly, when charged particles stagnate in the chamber 2, fine particles are more likely to accumulate on the reflection surface 23A of the EUV light focusing mirror 23. As a result, failure such as decrease of the reflectance of the EUV light focusing mirror 23 and the reflectance and transmittance of any other optical element can occur. When the optical elements are contaminated in this manner, the output of EUV light decreases or no EUV light is generated.

Each embodiment below exemplarily describes an extreme ultraviolet light generation device that can reduce contamination of optical elements.

4. Embodiment 1

4.1 Partial Configuration of Extreme Ultraviolet Light Generation Device

The following describes the configuration of an extreme ultraviolet light generation device as Embodiment 1. Any component identical to that in the above description is denoted by an identical reference sign, and duplicate description thereof will be omitted unless otherwise stated.

Figure 4:
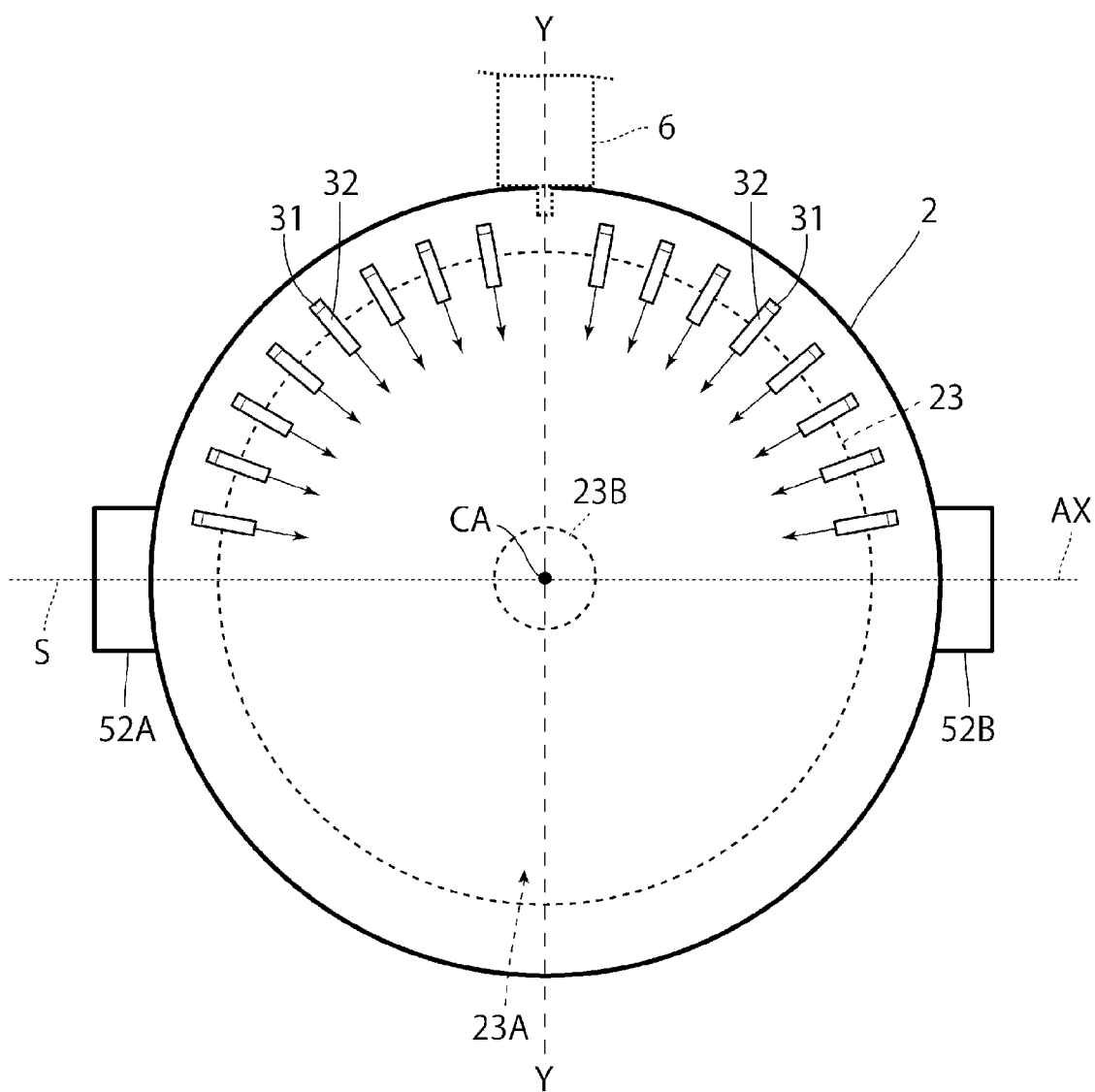
FIG. 4 is a pattern diagram of a schematic configuration of an extreme ultraviolet light generation device of Embodiment 1, illustrating a section taken along line X-X in FIG. 1.

FIG. 4 is a pattern diagram of a schematic configuration of the extreme ultraviolet light generation device of Embodiment 1, illustrating a section taken along line X-X in FIG. 1. However, the magnetic field generation unit 4 is omitted in FIG. 4. As illustrated in FIG. 4, the extreme ultraviolet light generation device of Embodiment 1 is different from the extreme ultraviolet light generation device of the comparative example in that some of the nozzles 32 of the etching gas supply unit 3 are not disposed.

Specifically, the nozzles 32 of the present embodiment are disposed at intervals at the outer periphery of the EUV light focusing mirror 23 on one side of a predetermined plane S, but no nozzle are disposed at the outer periphery on the other side of the plane S. The predetermined plane S includes the magnetic-field axis AX of the magnetic field ML and the central axis CA of the EUV light focusing mirror 23. In FIG.

4, the predetermined plane S is orthogonal to the sheet and thus illustrated as a dashed line that coincides with the magnetic-field axis AX. The central axis CA of the EUV light focusing mirror 23 may be a straight line passing through the first and second focal points of the reflection surface 23A or may be the rotational axis of the spheroidal surface as described above.

The ejection port of each nozzle 32 is disposed pointing toward the central axis CA of the EUV light focusing mirror 23 in the present embodiment, but may be disposed pointing, for example, in a direction orthogonal to the magnetic-field axis AX. The ejection port only needs to be disposed pointing from the one side of the predetermined plane S toward the other side. In place of the nozzles 32 disposed at intervals at the outer periphery on the one side of the predetermined plane S, one nozzle including ejection ports continuous with each other along the outer periphery may be disposed.

The droplet supply unit 6 is disposed on the one side of the predetermined plane S. As in FIG. 2, the droplet supply unit 6 is not disposed on line X-X in FIG. 1, and thus is illustrated with a dashed line in FIG. 4.

4.2 Operation

The etching gas supply unit 3 supplies etching gas along the reflection surface 23A from the outer periphery of the EUV light focusing mirror 23 on the one side of the predetermined plane S. The flow speed of supplied etching gas may be different between the nozzles 32 but is preferably substantially equal therebetween. The flow rate of etching gas ejected from each nozzle 32 is, for example, 10 L/min to 100 L/min, preferably 20 L/min to 40 L/min. The flow speed of etching gas ejected from each nozzle 32 is, for example, 20 m/s to 200 m/s.

Figure 5:
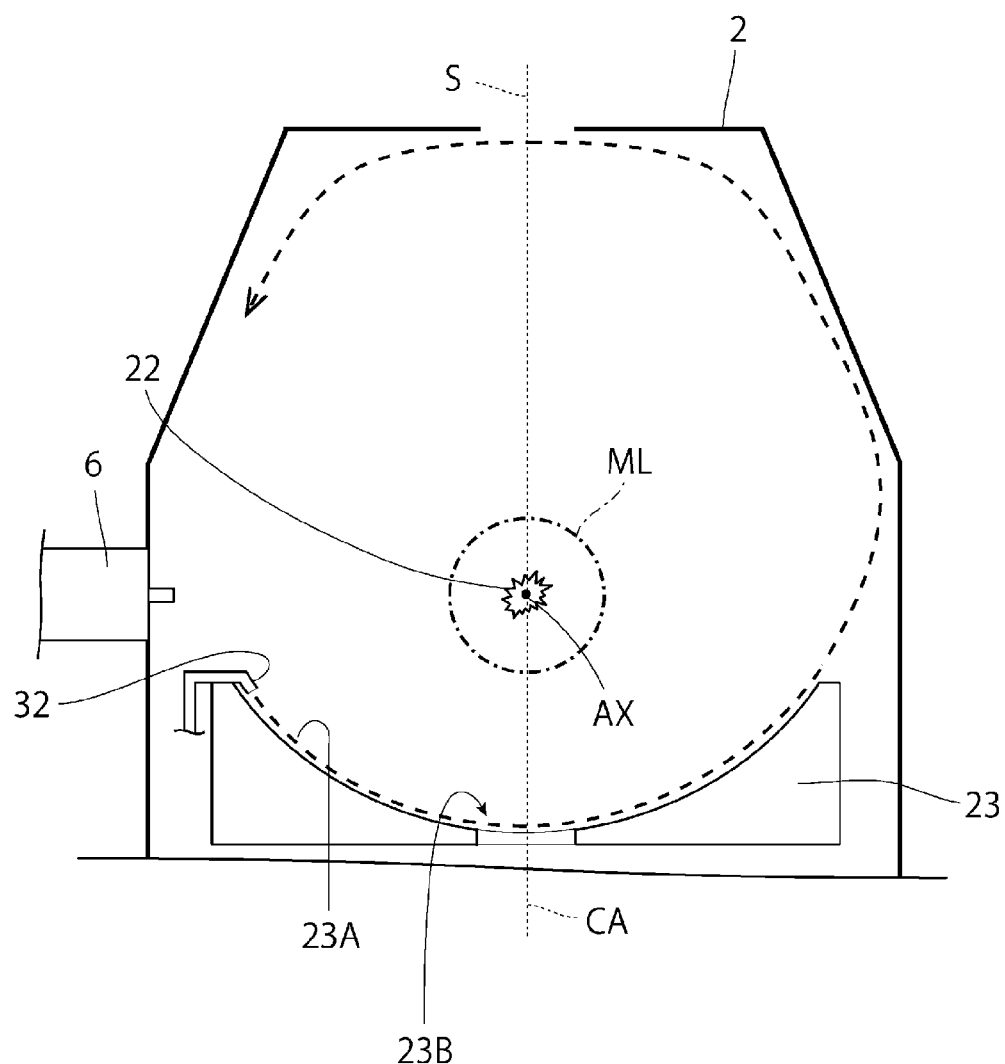
FIG. 5 is a pattern diagram illustrating the flow of etching gas in the chamber in Embodiment 1.

FIG. 5 is a pattern diagram illustrating the flow of etching gas in the chamber in Embodiment 1. FIG. 5 illustrates a section taken along line Y-Y in FIG. 4. In FIG. 5, the predetermined plane S is orthogonal to the sheet and thus is illustrated as a dashed line that coincides with the central axis CA of the EUV light focusing mirror 23. As illustrated in FIG. 5, etching gas flows toward the central axis CA along the reflection surface 23A of the EUV light focusing mirror 23 and flows through the central axis CA. Then, the etching gas flows toward the wall of the chamber 2 along the reflection surface 23A on the other side of the predetermined plane S.

Thereafter, the etching gas flows along the wall of the chamber, and part of the etching gas flows into the discharge ports 51A and 51B provided to the wall of the chamber 2. As described above, the etching gas having flowed into the discharge ports 51A and 51B is discharged through the discharge unit 5 together with components contained in the etching gas such as fine particles, charged particles, neutralized charged particles, and generated products described above.

4.3 Effect

In the extreme ultraviolet light generation device of the present embodiment, the etching gas supply unit 3 supplies etching gas along the reflection surface 23A only from the outer periphery of the EUV light focusing mirror 23 on the one side of the predetermined plane S. Thus, no etching gas is supplied from the outer periphery of the EUV light focusing mirror 23 on the other side of the predetermined plane S.

Accordingly, the etching gas flowing along the reflection surface 23A from the outer periphery on the one side of the predetermined plane S flows through the central axis CA of the EUV light focusing mirror 23 and flows along the reflection surface 23A on the other side of the plane S. Thereafter, the etching gas flows toward an exposure-apparatus connection unit of the chamber 2 along the wall of the chamber 2. Accordingly, the etching gas flows around the charged-particle convergence region including the plasma generating region 22. As described above, the density of charged particles is higher in the charged-particle convergence region than in the other space. Since the plasma generating region 22 is the generation source of charged particles and fine particles, the number of charged particles and fine particles is largest in the plasma generating region 22 right after plasma generation. When etching gas flows around the charged-particle convergence region including the plasma generating region 22 in this manner, the number of charged particles and fine particles diffused by the etching gas is reduced.

Accordingly, neutralization of a charged particle accumulating in the chamber 2 or generation of a new fine particle from the charged particle through collision with a fine particle in the chamber 2 is reduced. This results in reduction of decrease of the reflectance and transmittance of an optical element such as the EUV light focusing mirror 23 due to accumulation of fine particles on the reflection surface 23A of the EUV light focusing mirror 23 and any other optical element. In this manner, according to the extreme ultraviolet light generation device of the present embodiment, it is possible to reduce contamination of optical elements.

In the extreme ultraviolet light generation device of the present embodiment, the droplet supply unit 6 is disposed on the one side of the predetermined plane S. Etching gas flows along the EUV light focusing mirror 23 and the wall of the chamber 2 positioned downstream of the EUV light focusing mirror 23, flows through the exposure-apparatus connection unit, and then flows from the other side of the predetermined plane S to the one side through the predetermined plane S. Comparison is made between the flow speed of etching gas flowing along the wall on the other side of the predetermined plane S and the flow speed of etching gas flowing along the wall on the one side. The comparison indicates that the flow speed on the one side where the flow path thereto is longer is lower than the flow speed on the other side of the predetermined plane S. Thus, when the droplet supply unit 6 is disposed on the one side where the flow speed is lower, the trajectory of a droplet is unlikely to be disturbed by the flow of etching gas. As a result, plasma is appropriately generated from a droplet by a laser beam applied in the plasma generating region 22.

5. Embodiment 2

5.1 Partial Configuration of Extreme Ultraviolet Light Generation Device

The following describes a partial configuration of an extreme ultraviolet light generation device as Embodiment 2. Any component identical to that in the above description is denoted by an identical reference sign, and duplicate description thereof will be omitted unless otherwise stated.

Figure 6:
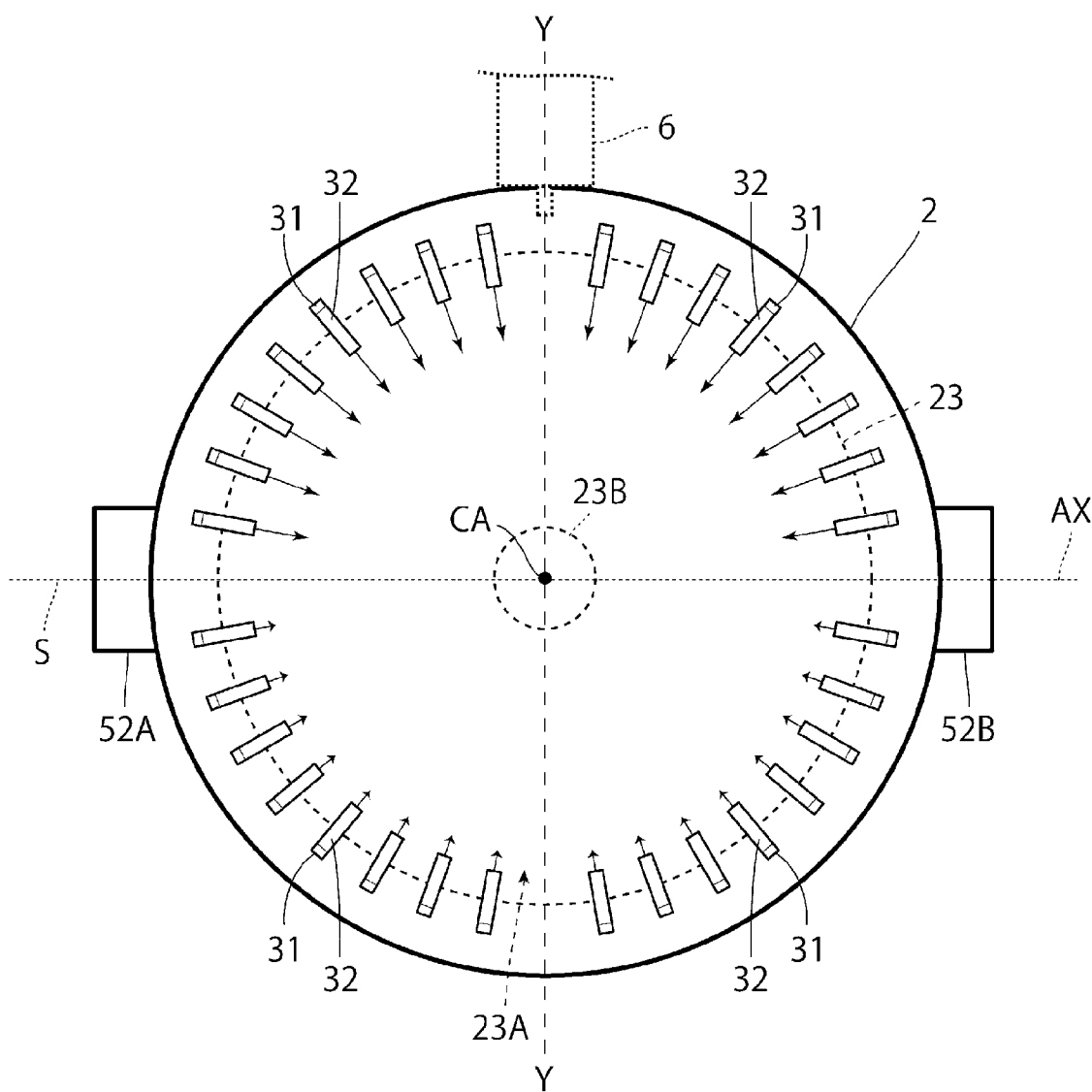
FIG. 6 is a pattern diagram of a schematic configuration of an extreme ultraviolet light generation device of Embodiment 2, illustrating a section taken along line X-X in FIG. 1.

FIG. 6 is a pattern diagram of a schematic configuration of the extreme ultraviolet light generation device of Embodiment 2, illustrating a section taken along line X-X in FIG. 1. However, the magnetic field generation unit 4 is omitted in FIG. 6. As illustrated in FIG. 6, the extreme ultraviolet light generation device of Embodiment 2 is different from the extreme ultraviolet light generation device of the comparative example in that the flow speed of supplied etching gas is different between the nozzles 32 of the etching gas supply unit 3.

Specifically, the nozzles 32 of the present embodiment are disposed at intervals at both of the outer periphery on the one side of the predetermined plane S and the outer periphery on the other side of the plane S. However, the flow speed of etching gas supplied from each nozzle 32 disposed at the outer periphery on the one side of the predetermined plane S is set to be higher than the flow speed of etching gas supplied from each nozzle 32 disposed at the outer periphery on the other side of the plane S.

For example, when the flow speed of etching gas supplied from the other side of the predetermined plane S is defined to be one, the flow speed of etching gas supplied from the one side of the plane S is two to four inclusive. The flow speed of etching gas supplied from the one side of the predetermined plane S may be switched in accordance with, for example, the diameter of a droplet, the energy of the laser beam PL, and the like.

Similarly to Embodiment 1 described above, the droplet supply unit 6 is disposed on the one side of the predetermined plane S.

5.2 Operation

The etching gas supply unit 3 supplies etching gas along the reflection surface 23A from the outer periphery of the EUV light focusing mirror 23. As described above, the flow speed of etching gas supplied from the outer periphery on the one side of the predetermined plane S is set to be higher than the flow speed of etching gas supplied from the outer periphery on the other side of the plane S.

Figure 7:
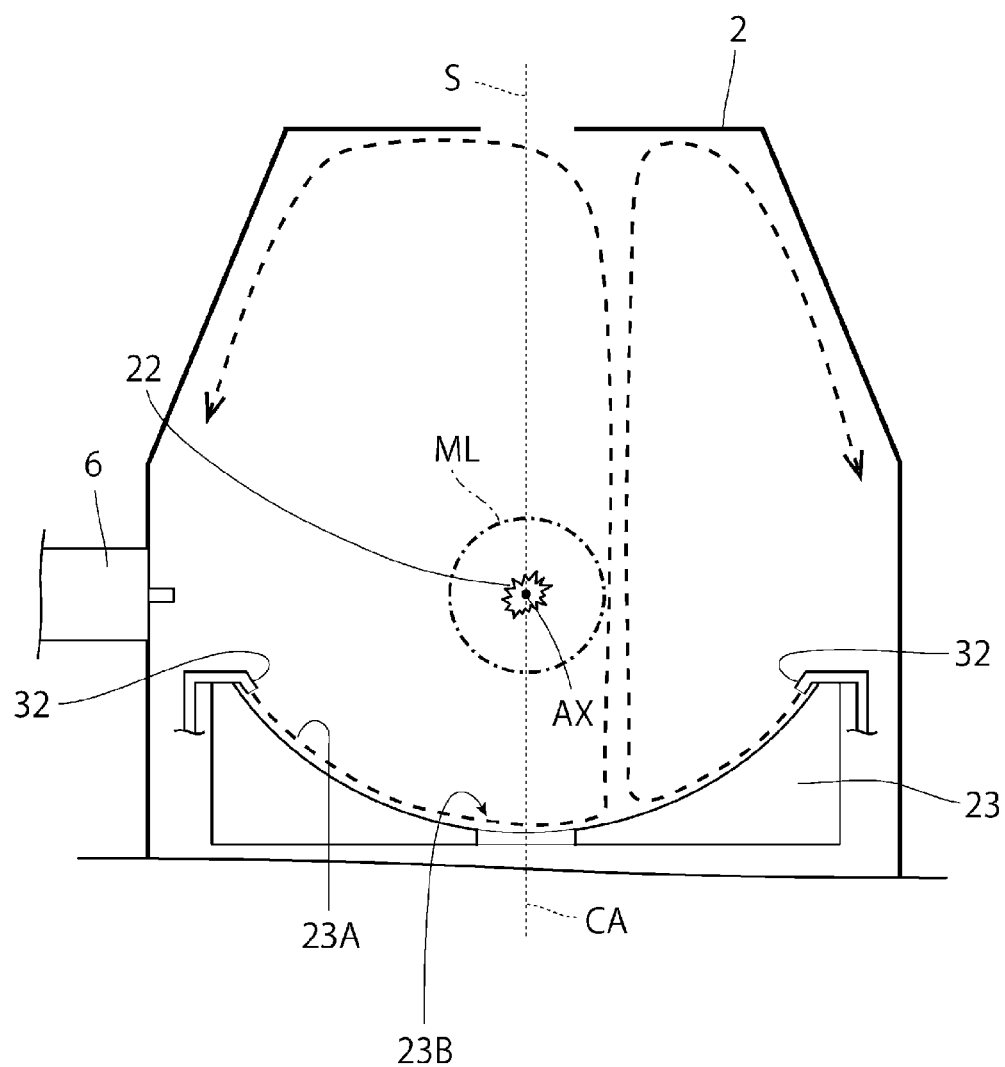
FIG. 7 is a pattern diagram illustrating the flow of etching gas in the chamber in Embodiment 2.

FIG. 7 is a pattern diagram illustrating the flow of etching gas in the chamber in Embodiment 2. FIG. 7 illustrates a section taken along line Y-Y in FIG. 6. As illustrated in FIG. 7, etching gas flows toward the central axis CA along the reflection surface 23A of the EUV light focusing mirror 23.

As described above, the flow speed of etching gas on the one side of the predetermined plane S is higher than the flow speed of etching gas on the other side of the plane S. Accordingly, etching gas flowing on the one side of the predetermined plane S and etching gas flowing on the other side of the plane S merge with each other at a position shifted from the central axis CA of the EUV light focusing mirror 23. Specifically, the merging position is shifted toward the other side of the predetermined plane S. Etching gas flows upward from the merging position in the direction departing from the reflection surface 23A and flows toward the vicinity of the exposure-apparatus connection unit of the chamber 2.

Thereafter, the etching gas flows along the wall of the chamber, and part of the etching gas flows into the discharge ports 51A and 51B provided to the wall of the chamber 2. As described above, the etching gas having flowed into the discharge ports 51A and 51B is discharged through the discharge unit 5 together with components contained in the etching gas such as fine particles, charged particles, neutralized charged particles, and generated products described above.

5.3 Effect

In the extreme ultraviolet light generation device of the present embodiment, the etching gas supply unit 3 is configured such that the flow speed of etching gas supplied from the outer periphery on the one side of the predetermined plane S is higher than the flow speed of etching gas supplied from the outer periphery on the other side of the plane S.

Accordingly, as described above, etching gas flowing on the one side of the predetermined plane S and etching gas flowing on the other side of the plane S merge with each other at a position shifted from the central axis CA of the EUV light focusing mirror 23. Thus, etching gas flows around the charged-particle convergence region including the plasma generating region 22 in which the number of charged particles and fine particles is largest, and the number of charged particles diffused by the etching gas is reduced.

Similarly to Embodiment 1, this results in reduction of decrease of the reflectance and transmittance of an optical element such as the EUV light focusing mirror 23 due to accumulation of fine particles on the reflection surface 23A of the EUV light focusing mirror 23 and any other optical element. In this manner, according to the extreme ultraviolet light generation device of the present embodiment, it is possible to reduce contamination of optical elements.

6. Embodiment 3

6.1 Partial Configuration of Extreme Ultraviolet Light Generation Device

The following describes a partial configuration of an extreme ultraviolet light generation device as Embodiment 3. Any component identical to that in the above description is denoted by an identical reference sign, and duplicate description thereof will be omitted unless otherwise stated.

Figure 8:
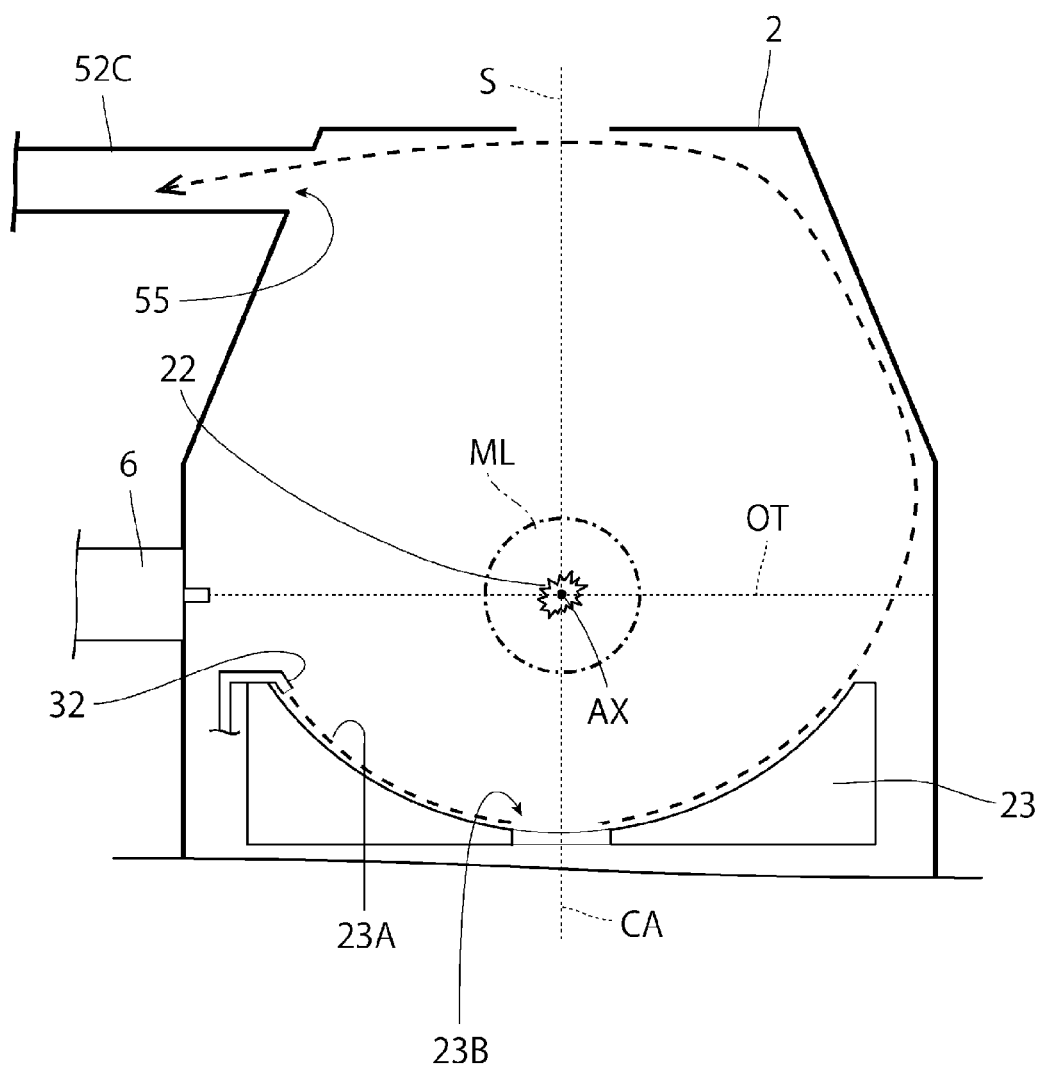
FIG. 8 is a pattern diagram of a schematic configuration of an extreme ultraviolet light generation device of Embodiment 3, illustrating a section same as that in FIG. 5.

FIG. 8 is a pattern diagram of a schematic configuration of the extreme ultraviolet light generation device of Embodiment 3, illustrating a section same as that in FIG. 5. As illustrated in FIG. 8, the extreme ultraviolet light generation device of Embodiment 3 is different from the extreme ultraviolet light generation device of Embodiment 1 in that an auxiliary discharge port 55 is newly provided to the wall of the chamber 2.

The auxiliary discharge port 55 is provided to the wall of the chamber 2 separately from the discharge ports 51A and 51B illustrated in FIG. 1. Similarly to the droplet supply unit 6 illustrated in FIG. 4, the auxiliary discharge port 55 of the present embodiment is provided to the wall of the chamber on the one side of the predetermined plane S.

In the relation with the magnetic-field axis AX of the magnetic field ML, the auxiliary discharge port 55 is positioned on a side opposite to the EUV light focusing mirror 23 with respect to the magnetic-field axis AX. This position is downstream of the EUV light focusing mirror 23 in the flow of etching gas supplied from the one side of the predetermined plane S. The discharge port 51A, the auxiliary discharge port 55, and the discharge port 51B are provided in the stated order on the further downstream side of the EUV light focusing mirror 23.

In the relation with a trajectory OT of a droplet DL, the auxiliary discharge port 55 is positioned on a side opposite to the EUV light focusing mirror 23 with respect to the trajectory OT. This position is downstream of the EUV light focusing mirror 23 in the flow of etching gas supplied from the one side of the predetermined plane S.

The auxiliary discharge port 55 is connected with a discharge unit (not illustrated) through a discharge pipe 52C. The discharge unit may be the discharge unit 5 connected with the discharge ports 51A and 51B through the discharge pipes 52A and 52B, or may be a discharge unit different from the discharge unit 5.

6.2 Operation

The etching gas supply unit 3 supplies etching gas along the reflection surface 23A from the outer periphery of the EUV light focusing mirror 23 on the one side of the predetermined plane S. As illustrated in FIG. 8, the etching gas flows through the central axis CA of the EUV light focusing mirror 23, and flows toward the wall of the chamber 2 along the reflection surface 23A on the other side of the predetermined plane S.

Thereafter, the etching gas flows along the wall of the chamber. Part of the etching gas flows into the discharge ports 51A and 51B and the other part flows along the wall of the chamber toward the auxiliary discharge port 55 positioned downstream of the discharge ports 51A and 51B. Part of the etching gas flowing toward the auxiliary discharge port 55 flows into the auxiliary discharge port 55. Similarly to Embodiment 1, the etching gas having flowed into the discharge ports 51A and 51B and the auxiliary discharge port 55 is discharged together with components contained in the etching gas such as fine particles, charged particles, neutralized charged particles, and generated products described above.

6.3 Effect

The extreme ultraviolet light generation device of the present embodiment includes the auxiliary discharge port 55 provided to the wall of the chamber 2 different from the wall of the chamber 2 to which the discharge ports 51A and 51B are provided. In the relation with the magnetic-field axis AX of the magnetic field ML, the auxiliary discharge port 55 is positioned on the side opposite to the EUV light focusing mirror 23 with respect to the magnetic-field axis AX.

Accordingly, as described above, the auxiliary discharge port 55 is at least positioned downstream of the EUV light focusing mirror 23 in the flow of etching gas supplied from the one side of the predetermined plane S. Thus, a larger amount of etching gas downstream of the EUV light focusing mirror 23 and components contained in the etching gas such as fine particles, charged particles, neutralized charged particles, and generated products described above are discharged. This results in reduction of the amount of etching gas flowing along the wall of the chamber 2 and returning to the EUV light focusing mirror 23 again, which further reduces the number of fine particles accumulating on the reflection surface 23A of the EUV light focusing mirror 23. In this manner, according to the extreme ultraviolet light generation device of the present embodiment, it is possible to reduce contamination of optical elements.

In the relation with the trajectory OT of the droplet DL, the auxiliary discharge port 55 of the present embodiment is positioned on the side opposite to the EUV light focusing mirror 23 with respect to the trajectory OT. Similarly to the above description, this position is downstream of the EUV light focusing mirror 23, and thus a larger amount of etching gas on the downstream side and components contained in the etching gas can be discharged. As described above, this results in reduction of the amount of etching gas flowing along the wall of the chamber 2 and returning to the EUV light focusing mirror 23 again, which further reduces the number of fine particles accumulating on the reflection surface 23A of the EUV light focusing mirror 23.

7. Embodiment 4

7.1 Partial Configuration of Extreme Ultraviolet Light Generation Device

The following describes a partial configuration of an extreme ultraviolet light generation device as Embodiment 4. Any component identical to that in the above description is denoted by an identical reference sign, and duplicate description thereof will be omitted unless otherwise stated.

Figure 9:
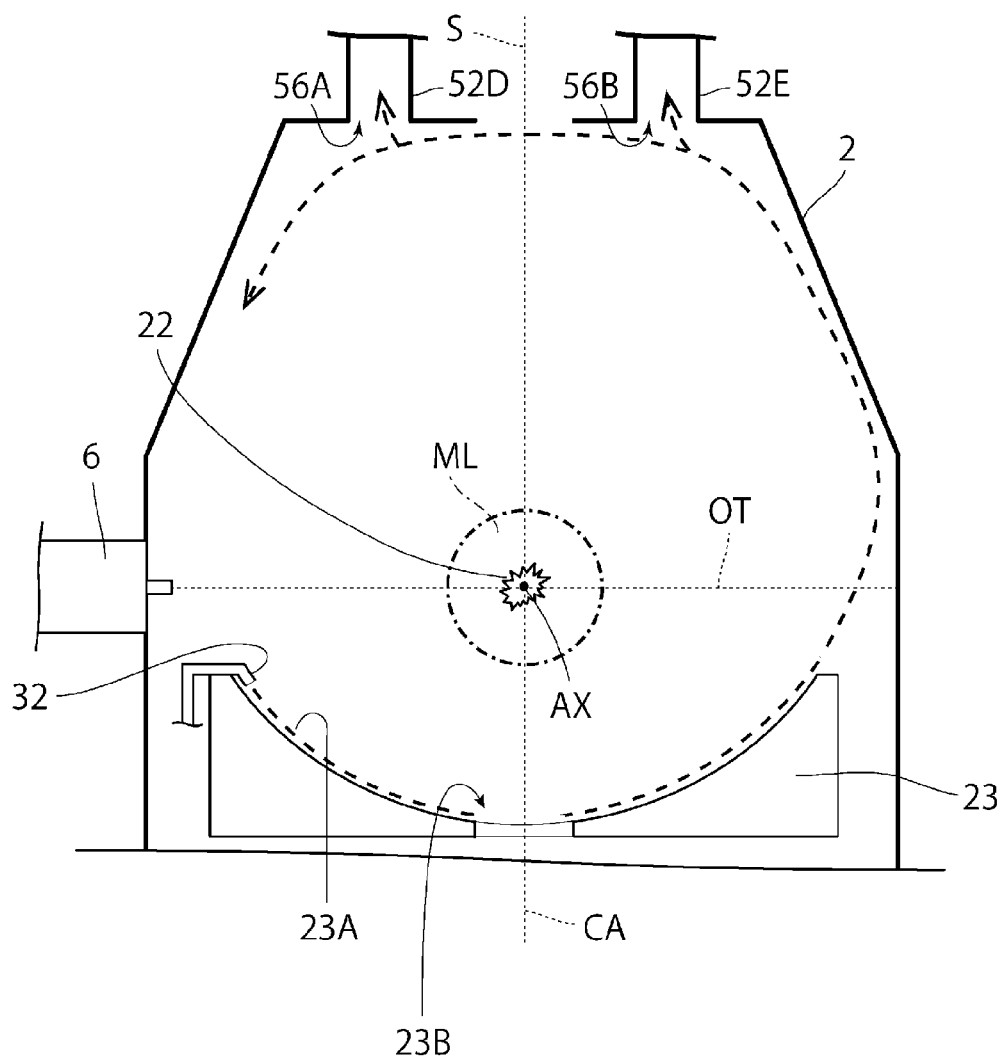
FIG. 9 is a pattern diagram of a schematic configuration of an extreme ultraviolet light generation device of Embodiment 4, illustrating a section same as that in FIG. 5.

FIG. 9 is a pattern diagram of a schematic configuration of the extreme ultraviolet light generation device of Embodiment 4, illustrating a section same as that in FIG. 5. As illustrated in FIG. 9, the extreme ultraviolet light generation device of Embodiment 4 is different from the extreme ultraviolet light generation device of Embodiment 1 in that a pair of auxiliary discharge ports 56A and 56B are newly provided to the wall of the chamber 2.

The auxiliary discharge ports 56A and 56B are positioned on the side opposite to the EUV light focusing mirror 23 with respect to the magnetic-field axis AX of the magnetic field ML, which is a feature common to the auxiliary discharge port 55 of Embodiment 3. In addition, the auxiliary discharge ports 56A and 56B are positioned on the side opposite to the EUV light focusing mirror 23 with respect to the trajectory OT of the droplet DL, which is another feature common to the auxiliary discharge port 55 of Embodiment 3.

However, the auxiliary discharge ports 56A and 56B have opening planes disposed substantially in parallel to the direction of etching gas flowing along the wall of the chamber 2, which is a feature different from the auxiliary discharge port 55 of Embodiment 3 disposed across the direction.

The auxiliary discharge ports 56A and 56B are connected with a discharge unit (not illustrated) through discharge pipes 52D and 52E. The discharge unit may be the discharge unit 5 connected with the discharge ports 51A and 51B through the discharge pipes 52A and 52B or may be a discharge unit different from the discharge unit 5.

7.2 Operation

The etching gas supply unit 3 supplies etching gas along the reflection surface 23A from the outer periphery of the EUV light focusing mirror 23 on the one side of the predetermined plane S. As illustrated in FIG. 9, the etching gas flows through the central axis CA of the EUV light focusing mirror 23 and flows toward the wall of the chamber 2 along the reflection surface 23A on the other side of the predetermined plane S.

Thereafter, the etching gas flows along the wall of the chamber 2. Part of the etching gas flows into the discharge ports 51A and 51B, and the other part flows toward the auxiliary discharge ports 56A and 56B positioned downstream of the discharge ports 51A and 51B along the wall of the chamber 2. Part of the etching gas flowing toward the auxiliary discharge ports 56A and 56B flows into the auxiliary discharge ports 56A and 56B. The etching gas having flowed into the discharge ports 51A and 51B and the auxiliary discharge ports 56A and 56B is discharged together with components contained in the etching gas such as fine particles, charged particles, neutralized charged particles, and generated products described above.

7.3 Effect

Similarly to the auxiliary discharge port 55 of Embodiment 3, the auxiliary discharge ports 56A and 56B of the extreme ultraviolet light generation device of the present embodiment are provided to the wall of the chamber 2 different from the wall of the chamber 2 to which the discharge ports 51A and 51B are provided, and are positioned on the side opposite to the EUV light focusing mirror 23 with respect to the magnetic-field axis AX of the magnetic field ML.

Thus, similarly to Embodiment 3, a larger amount of etching gas downstream of the EUV light focusing mirror 23 and components contained in the etching gas such as fine particles, charged particles, neutralized charged particles, and generated products described above are discharged. This results in reduction of the amount of etching gas flowing along the wall of the chamber 2 and returning to the EUV light focusing mirror 23 again, which further reduces the number of fine particles accumulating on the reflection surface 23A of the EUV light focusing mirror 23. In this manner, according to the extreme ultraviolet light generation device of the present embodiment, it is possible to reduce contamination of optical elements.

The opening planes of the auxiliary discharge ports 56A and 56B of the present embodiment are disposed substantially in parallel to the direction of etching gas flowing along the wall of the chamber 2.

Accordingly, the freedom of disposing the auxiliary discharge ports 56A and 56B on the wall surface of the chamber 2 increases. A large number of various sensors and the like (not illustrated) are often disposed on the wall surface of the chamber 2. In such a case, as well, the opening planes of the auxiliary discharge ports 56A and 56B only need to be disposed substantially in parallel to the direction of etching gas flowing along the wall of the chamber 2, which can be easily performed.

8. Embodiment 5

8.1 Partial Configuration of Extreme Ultraviolet Light Generation Device

The following describes a partial configuration of an extreme ultraviolet light generation device as Embodiment 5. Any component identical to that in the above description is denoted by an identical reference sign, and duplicate description thereof will be omitted unless otherwise stated.

Figure 10:
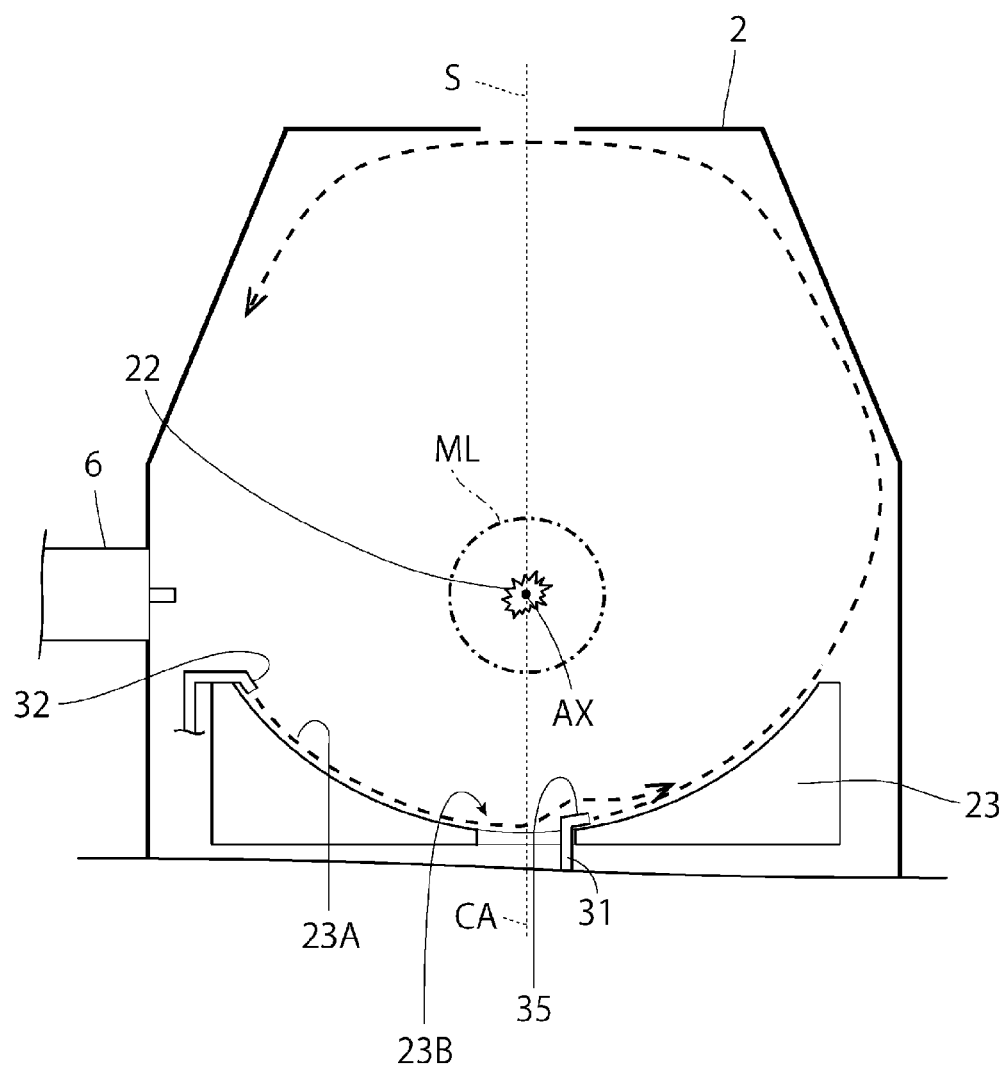
FIG. 10 is a pattern diagram of a schematic configuration of an extreme ultraviolet light generation device of Embodiment 5, illustrating a section same as that in FIG. 5.

FIG. 10 is a pattern diagram of a schematic configuration of the extreme ultraviolet light generation device of Embodiment 5, illustrating a section same as that in FIG. 5. As illustrated in FIG. 10, the extreme ultraviolet light generation device of Embodiment 5 is different from the extreme ultraviolet light generation device of Embodiment 1 in that a sub nozzle 35 different from the nozzles 32 provided at the outer periphery of the EUV light focusing mirror 23 is newly provided.

The sub nozzle 35 is provided at the outer periphery of the through-hole 23B at the reflection surface 23A of the EUV light focusing mirror 23. The sub nozzle 35 has an ejection port disposed pointing toward the other side of the predetermined plane S. The sub nozzle 35 is connected with a gas supply unit (not illustrated) through the gas introduction pipe 31. The number of sub nozzles 35 may be one or any plural number.

The flow speed of etching gas supplied from the sub nozzle 35 is set to be lower than the flow speed of etching gas supplied from the nozzles 32. For example, when the flow speed of etching gas supplied from the sub nozzle 35 is defined to be one, the flow speed of etching gas supplied from the nozzles 32 is two to four inclusive. The flow speed of etching gas supplied from the sub nozzle 35 may be switched in accordance with, for example, the diameter of a droplet, the energy of the laser beam PL, and the like.

8.2 Operation

The etching gas supply unit 3 supplies etching gas from the outer periphery on the one side of the predetermined plane S, and also supplies etching gas from the outer periphery of the through-hole 23B at the reflection surface 23A toward the other side of the plane S. As illustrated in FIG. 10, etching gas supplied from the nozzles 32 flows from the one side of the predetermined plane S to the other side along the reflection surface 23A of the EUV light focusing mirror 23. The etching gas flowing to the other side merges with the etching gas supplied from the sub nozzle 35 and flows toward the wall of the chamber 2 along the reflection surface 23A of the EUV light focusing mirror 23.

Thereafter, the etching gas flows along the wall of the chamber, and part of the etching gas flows into the discharge ports 51A and 51B provided to the wall of the chamber 2. As described above, the etching gas having flowed into the discharge ports 51A and 51B is discharged together with components contained in the etching gas such as fine particles, charged particles, neutralized charged particles, and generated products described above.

8.3 Effect

Similarly to Embodiment 1, in the extreme ultraviolet light generation device of the present embodiment, the etching gas supply unit 3 supplies etching gas along the reflection surface 23A of the EUV light focusing mirror 23 from the nozzles 32 on the one side of the predetermined plane S. While flowing along the reflection surface 23A of the EUV light focusing mirror 23, part of the etching gas supplied from the nozzles 32 reacts with any fine particle adhering to the reflection surface 23A. Accordingly, the flow speed of etching gas flowing along the reflection surface 23A of the EUV light focusing mirror 23 tends to decrease as the etching gas is farther away from the nozzles 32. The capability of preventing contamination of the reflection surface 23A degrades when the flow speed excessively decreases.

The etching gas supply unit 3 of the present embodiment not only supplies etching gas from the nozzles 32, but also supplies etching gas along the reflection surface 23A from the outer periphery of the through-hole 23B of the EUV light focusing mirror 23 toward the other side of the predetermined plane S.

Accordingly, when etching gas flows from the one side of the predetermined plane S to the other side, the flow speed of etching gas is supplemented. Thus, according to the extreme ultraviolet light generation device of the present embodiment, it is possible to supply etching gas along the reflection surface 23A of the EUV light focusing mirror 23 at an appropriate flow speed, and as a result, to maintain the capability of preventing contamination of the reflection surface 23A at a certain level or higher.

The above description is intended to provide not restriction but examples. Thus, the skilled person in the art would clearly understand that the embodiments and modifications of the present disclosure may be changed without departing from the scope of the appended claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". It should be understood that the indefinite article "a" in the present specification and the claims means "at least one" or "one or more".

What is claimed is:

1. An extreme ultraviolet light generation device comprising:
    a chamber having inside a plasma generating region in which plasma is generated from a droplet of a target substance;
    an EUV light focusing mirror having a reflection surface that reflects EUV light generated by the droplet being turned into the plasma in the plasma generating region;
    a magnetic field generation unit configured to generate a magnetic field for converging, toward a wall of the chamber, a charged particle generated by the droplet being turned into the plasma in the plasma generating region; and
    an etching gas supply unit configured to supply etching gas along the reflection surface from an outer periphery of the EUV light focusing mirror, the etching gas supply unit being configured such that flow speed of etching gas supplied from one side of a plane including a magnetic-field axis of the magnetic field and a central axis of the EUV light focusing mirror is higher than flow speed of etching gas supplied from the other side of the plane, and flow speed from the other side of the plane is nonzero.

2. The extreme ultraviolet light generation device according to claim 1, wherein the etching gas supply unit is configured such that the flow speed F1 (m/s) of etching gas supplied from the one side of the plane is no less than two times and no more than four times the flow speed F2 (m/s) of etching gas supplied from the other side of the plane.

3. The extreme ultraviolet light generation device according to claim 1, further comprising a droplet supply unit configured to supply the droplet into the chamber, wherein the droplet supply unit is disposed on the one side of the plane.

4. The extreme ultraviolet light generation device according to claim 3, further comprising a discharge port provided to a wall of the chamber and positioned on the magnetic-field axis of the magnetic field.

5. The extreme ultraviolet light generation device according to claim 4, further comprising an auxiliary discharge port provided to a wall of the chamber different from the wall of the chamber to which the discharge port is provided, the auxiliary discharge port being positioned on a side opposite to a side of the EUV light focusing mirror with respect to the magnetic-field axis of the magnetic field.

6. The extreme ultraviolet light generation device according to claim 4, further comprising an auxiliary discharge port provided to a wall of the chamber different from the wall of the chamber to which the discharge port is provided, the auxiliary discharge port being positioned on a side opposite to a side of the EUV light focusing mirror with respect to the trajectory of the droplet.

7. The extreme ultraviolet light generation device according to claim 1, wherein
the EUV light focusing mirror has a through-hole along the central axis, and
the etching gas supply unit supplies etching gas along the reflection surface from the outer periphery of the EUV light focusing mirror, and supplies etching gas along the reflection surface from an outer periphery of the through-hole on the reflection surface toward the other side of the plane.

8. The extreme ultraviolet light generation device according to claim 1, wherein the target substance is tin, and the etching gas contains hydrogen.

9. The extreme ultraviolet light generation device according to claim 1, wherein the flow speed of etching gas supplied from the one side of the plane is 20 m/s to 200 m/s.

* * * * *